US 6,587,708 B2

(12) United States Patent
Venkatesan et al.

(10) Patent No.: US 6,587,708 B2
(45) Date of Patent: Jul. 1, 2003

(54) METHOD FOR COHERENT STEADY-STATE IMAGING OF CONSTANT-VELOCITY FLOWING FLUIDS

(75) Inventors: Ramesh Venkatesan, Karnataka (IN); Amjad Jabbar, Bangalore (IN); Tisha Ahraham, Bangalore (IN)

(73) Assignee: GE Medical Systems Global Technology, LLC, Waukesha, WI (US)

( * ) Notice: Subject to any disclaimer, the term of this patent is extended or adjusted under 35 U.S.C. 154(b) by 158 days.

(21) Appl. No.: 09/812,408

(22) Filed: Mar. 20, 2001

(65) Prior Publication Data

US 2003/0030435 A1 Feb. 13, 2003

Related U.S. Application Data

(60) Provisional application No. 60/258,697, filed on Dec. 29, 2000.

(51) Int. Cl.[7] .............................................. A61B 5/055
(52) U.S. Cl. ...................... 600/419; 600/410; 600/420; 324/306; 324/309
(58) Field of Search ............................... 600/407, 410, 600/420, 411, 419; 324/306, 307, 309

(56) References Cited

U.S. PATENT DOCUMENTS

| | | | |
|---|---|---|---|
| 4,532,474 A | | 7/1985 | Edelstein |
| 4,683,431 A | * | 7/1987 | Pattany et al. ............... 324/306 |
| 4,699,148 A | * | 10/1987 | Gyngell ........................ 324/309 |
| 4,746,864 A | * | 5/1988 | Satoh .......................... 324/307 |
| 5,517,120 A | * | 5/1996 | Misic et al. .................. 324/318 |
| 5,746,208 A | * | 5/1998 | Prince .......................... 600/410 |

OTHER PUBLICATIONS

J.W. Casselman, et al Neuroradiology (1996) 38:278–286; Spring 1996 Inner ear malformations in patients with sensorineural hearing loss; detection with gradient–echo (3DFT–CISS) MRI.

Michael L. Wood, et al; Med. Phys. 18(5) Sep./Oct. 1991; "Gradient moment nulling for steady–state free precession MR Imaging of cerebrospinal fluid".

Robert Gasparotti, et AK; American Journal of Neuroradiology 18:1733–1742, Oct. 1997; "Three–dimensional MR myelograph of Traumatic Injuries of the Brachial Plexus".

E. Mark Haacke, et al; Magnetic Resonance Imaging: Physical Principles and Sequence Design, Chapter 18, "Fast Imaging in the Steady State", 1999.

E. Mark Haacke, et al; Magnetic Resonance Imaging: Physical Principles and Sequence Design, Chapter 23 "Motion Artifacts and Flow Compensation", 1999.

* cited by examiner

Primary Examiner—Ruth S. Smith
Assistant Examiner—Barry Pass
(74) Attorney, Agent, or Firm—Peter J. Vogel

(57) ABSTRACT

An imaging apparatus particularly suitable for nuclear magnetic imaging has a transmitter coil generating a plurality a first rf pulse and a second rf pulse having a repetition time therebetween. A first gradient coil is used to generate a first gradient waveform substantially centered within the repetition time. A second gradient is used to generate a second gradient waveform substantially centered within the repetition time. A receiver coil receives a resonance signal substantially centered within the repetition time. A controller is coupled to the receiver coil and forms an image in response to said resonance signal.

30 Claims, 6 Drawing Sheets

METHOD FOR COHERENT STEADY-STATE IMAGING OF CONSTANT-VELOCITY FLOWING FLUIDS

This application claims the benefit of Provisional application Ser. No. 60/258,697, filed Dec. 29, 2000.

TECHNICAL FIELD

The present invention relates generally to magnetic resonance imaging, and more particularly, to an improved timing sequence of controlling gradient signals relative to rf pulses to provide a system for magnetic resonance imaging of moving fluids.

BACKGROUND ART

NMR imaging as a medical diagnostic tool offers a number of important advantages over the various other means available for probing the human body. The most significant of these advantages result from the completely non-invasive nature of the technology, and the ability to obtain spatially encoded specimen data with a high degree of precision. Additionally, NMR has minimal, if any, hazards for either patients or operators of the apparatus; and perhaps most importantly, NMR image intensities are increasingly being found to be sensitive to various disease states. Clinical studies have shown that the relaxation time of malignant tissues are in general longer than those of the tissues of origin. This property is apparently not unique to cancerous tissue, but rather is indicative of the changes in molecular level structure of water associated with certain disease states. Other pathologies of NMR imaging include hydrocephalus; a carotid artery aneurysm; edema associated with kidney transplants; liver cirrhosis and several others.

In general, known NMR techniques for imaging of body tissue have tended to be of somewhat limited image quality, spatial resolution, and have required comparatively long imaging times to complete. In view of these technical and medical considerations, it is clearly of importance to improve NMR imaging technology by all available means. In particular, signal to noise ratios need to be increased, imaging times need to be shortened, spatial resolution needs to be enhanced, and imaging of the transverse and/or longitudinal relaxation times need to be accomplished. Many of these factors are not mutually exclusive. As a result, there has been a tendency to trade an improvement in one factor to the detriment of others. These trade-offs are not always salutary, further pointing to the need for basic improvements in NMR methods and apparatus.

Magnetic resonance imaging is presently being used to cover an increasing range of NMR techniques wherein static magnetic fields (to produce polarization of nuclei) are combined with field gradients (to spatially encode the sample volume of interest) and with rf fields (to spatially reorient polarized nuclei) to achieve a wide range of objectives, including imaging. In the recent past, the technical and patent literature have burgeoned reporting results of successive advances in the field. While the field has progressed steadily, certain intrinsic drawbacks have heretofore precluded the use of NMR high resolution imaging in medicine. Chief among these are comparatively slow relaxation times of human tissue, and body motion due both to inherent movements within the body as well as the difficulty of keeping the body stationary for long periods of time.

Biological tissue is known to have longitudinal (or spin-lattice) relaxation times $T_1$, and transverse (or spin-spin) relaxation times $T_2$, in the range of 0.04 to 3 seconds. Both of these time constants are exceedingly long as compared to the speed of the instrumentation presently available to process NMR signals. Also, high resolution imaging requires a large number of pixels, each of which may be the result of a complete NMR pulse projection, where each NMR projection is at least influenced by if not limited by these long time constants.

The signal obtained with steady-state pulse sequences in imaging depends on the magnetic field experienced by a spin in addition to intrinsic nuclear magnetic resonance parameters such as spin density, T1 and T2. This means that two spins with identical NMR parameters can have signal differences just because they experience different magnetic fields imposed by unavoidable magnetic field inhomogeneities. This resonant offset angle dependence of the signal can be reduced by minimizing the sequence repetition time, which has become possible with rapid advances in the data acquisition and gradient hardware capabilities.

In certain applications, it may be desirable to image moving fluids. Attempts using known methods results in voids in the images or incomprehensible images.

Current methodologies for steady-state gradient-echo pulse sequence design only insure that the zeroth moments (time integral of the gradient waveform over any TR period) of imaging gradients are nulled over each repetition period (TR). This results in a velocity dependence of the resonant offset angle ($\beta$) of moving spins, which in turn results in poor image quality for the moving fluids.

It would therefore be desirable to provide a method for imaging that is robust enough to handle a reasonable range of magnetic field inhomogeneities that also reduce the velocity dependence of the imaging signal.

SUMMARY OF THE INVENTION

It is therefore one object of the invention to provide a simple steady-state imaging pulse sequence design method to ensure that the resonance offset angle (resonance offset angle $\beta = \gamma \Delta BTR$; $\beta$: phase angle accumulated by off-resonance spins during each repetition period) is independent of the velocity of spins in moving body fluids. This will result in a uniform steady-state signal response for a set of moving spins that have a distribution of velocities, which is typical of most physiological flow patterns.

In one aspect of the invention, an imaging apparatus particularly suitable for nuclear magnetic imaging has a transmitter coil generating a plurality of a first rf pulse and a second rf pulse having a repetition time therebetween. A first gradient coil is used to generate a first gradient waveform substantially centered within the repetition time. A second gradient is used to generate a second gradient waveform substantially centered within the repetition time. A receiver coil receives a resonance signal substantially centered within the repetition time. A controller is coupled to the receiver coil and forms an image in response to said resonance signal.

In a further aspect of the invention, a method of imaging comprises the steps of:

applying a first rf pulse and a second rf pulse having a repetition time;

generating a first gradient waveform substantially centered within said repetition time;

generating a second gradient waveform substantially centered within the repetition time;

receiving a resonance signal substantially centered within the repetition time; and forming an image in response to said resonance signal.

One advantage of the invention is the inherent velocity compensation property which allows images of moving fluids. Another advantage of the invention is that the recovery of velocity compensated components of the signal acquired at a few resonant offset angles between zero and $2\pi$ allows the use in imaging the cervical spine where the cerebrospinal fluid flows significant enough to cause signal voids in other known imaging systems. Yet another advantage of the invention is that because of high resolution capability, imaging of such structures as the inner ear including the cochlear cavity and cranial nerves in the cerebello-pontine angle may be achieved.

Other objects and advantages of the present invention will become apparent upon the following detailed description and appended claims, and upon reference to the accompanying drawings.

DETAILED DESCRIPTION OF THE PREFERRED EMBODIMENT

Figure 1:
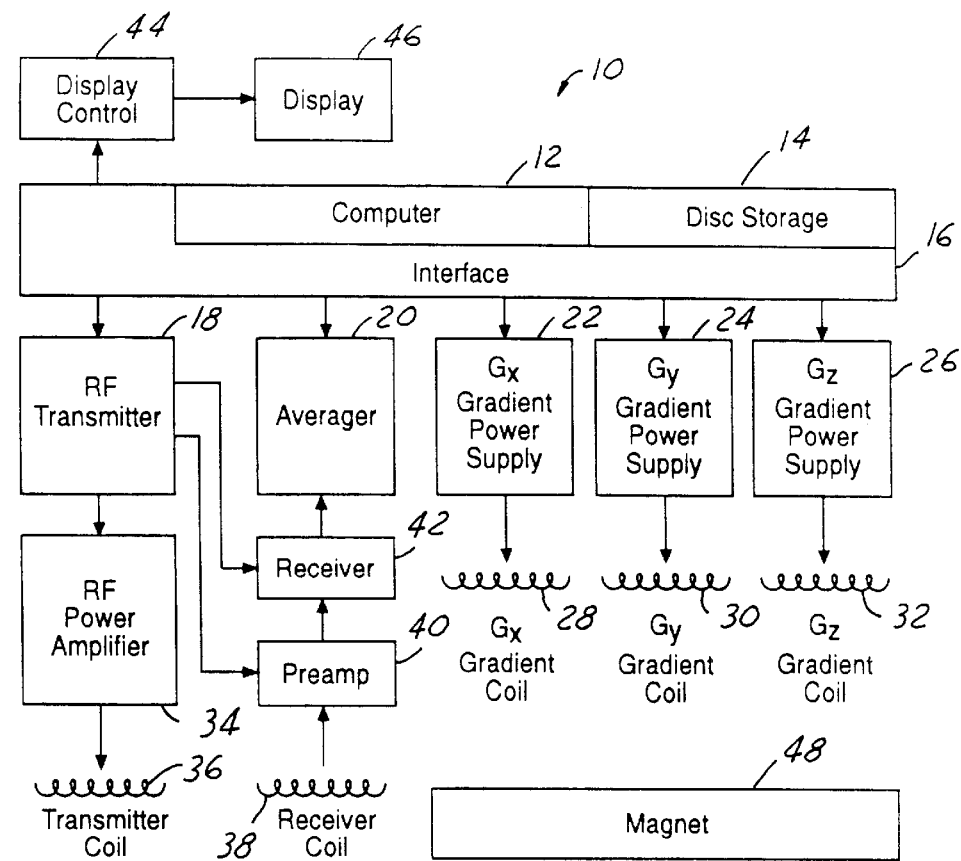
FIG. 1 is a block diagrammatic view of a nuclear magnetic resonance system according to the present invention.

In the following figures the same reference numerals will be used to identify the same components in the various views. While the present invention is illustrated with respect to nuclear magnetic resonance imaging, other forms of imaging may benefit from the teachings of the present invention.

Referring now to FIG. 1, a simplified block diagram showing the major components of an NMR imaging apparatus 10 suitable for implementing the present invention. The overall system, generally designated, is made up of a general-purpose minicomputer 12 which is functionally coupled to a disc storage unit 14 and an interface unit 16. An rf transmitter 18, signal averager 20, and gradient power supplies 22, 24, 26 are coupled to the computer 12 through interface unit 16. The three gradient power supplies are used for energizing, respectively, a set of three gradient coils 28, 30, 32. These coils may be referred to by axis (X, Y or Z) or by various names such as slice, read and phase.

The rf transmitter 18 is gated with pulse envelopes from computer 12 to generate rf pulses having the required modulation to excite resonance in the sample being imaged. The time between the pulses is referred to as the repetition time (TR). The rf pulses are amplified in an rf power amplifier 34 to levels varying from 100 watts to several kilowatts, depending on the imaging method, and are applied to a transmitter coil 36. The high power levels are necessary for large sample volumes such as are encountered in whole body imaging, and where short duration pulses are required to excite NMR frequency bandwidths.

The resulting NMR signal is sensed by a receiver coil 38 whereafter it is processed into an image. The sensed signal is amplified in a low noise preamplifier 40, and thereafter routed to a receiver 42 for further amplification, detection, and filtering. This groomed NMR signal is then digitized and averaged by the signal averager 20, and routed to computer 12 for further processing. The processed signals are routed from the computer 12 via the interface 16 to a display control unit 44 where they are stored, reformatted and applied to a display unit 46. The display unit 46 may include a variety of data presentation means, such as CRT-type displays, as well as hard copy devices. The CRT displays may comprise direct viewing storage tube (DVST) types and conventional black and white or color TV-like CRTs. These displays may include directly viewable calibration traces and the like. The hard copy output devices may comprise printers such as line printers, TTY terminals, and photographic image producers.

The preamplifier and receiver may be protected from the rf pulses during transmission by active disabling gating and/or by passive filtering. Computer 12 provides gating and envelope modulation for the NMR pulses, blanking for the preamplifier and rf power amplifier, and voltage waveforms for the gradient power supplies. The computer 12 performs data processing such as Fourier transforms, image reconstruction, data filtering, image display, and storage functions, all of which are well known and do not form an intrinsic part of the present invention.

The transmitter and receiver rf coils may be configured as a single coil. Alternatively, two separate coils that are electrically orthogonal may be used. The latter configuration has the advantage of reduced rf pulse breakthrough into the receiver during the pulse transmission. In both cases, the coils are orthogonal to the direction of the static magnetic field $B_0$ produced by a magnet 48. The coils are isolated from the remainder of the system by enclosure in an rf shielded cage.

Magnetic field gradient coils are necessary to provide the $G_x$, $G_y$, and $G_z$ gradients a slice, read and phase gradients, respectively. In the multiple angle projection reconstruction and spin-warp methods normally used for magnetic resonance imaging, the gradients should be monotonic and linear over the sample volume. Multi-valued gradient fields cause a degradation in the NMR signal data, known as aliasing, can lead to severe image artifacts. Nonlinear gradients cause geometric distortions of the image.

To obtain the improvements of the present invention, a particular timing sequence is used in the generation of the gradient signals relative to the rf pulses. The present invention uses a coherent steady-state signal. The coherent steady-state signal is a result of isochromats along an infinite number of spin coherence pathways refocusing together at the same instant as each new rf pulse in the sequence (so-called "rf echo"). This signal is dependent on the field inhomogeneity-induced resonance offset angle ($\beta$) over each TR period in addition to the NMR tissue properties such as spin density, T1 and T2. At an optimal flip-angle that depends only on the ratio (T1/T2) such that tissues with larger T1/T2 values have lower optimal flip-angles, this dependence on $\beta$ is reduced to a level whereby it is essentially constant and stays at its peak value for $-\pi/2 \leq \beta \leq \pi/2$.

The signal drops to its minimum value quite rapidly as $\beta=0$ is approached from these limits. The maximum steady-state signal is once again dependent on the ratio (T1/T2) and the spin density, such that tissues with lower T1/T2 values have higher signal. Since fluids have the lowest T1/T2 values intrinsically, this pulse sequence highlights fluids such as cerebro-spinal fluid (CSF). Additionally, when a high relaxivity contrast agent is introduced in the blood, the T1 value of blood tends to approach T2, thereby reducing its T1/T2 value towards unity as the concentration of the contrast agent in the blood increases. As a result, the present invention sequence also highlights blood that contains contrast agents.

In general, the signal dependence on is minimized by reducing the spread of β values across the region of the body being scanned. This is achieved by good shimming, running the sequence with as short a TR as possible at the optimal flip-angle for the tissue-of-interest, and forcing the β range to be spread out around β=π rather than around β=0 (achieved by using alternating rf pulses in the pulse sequence).

A steady-state imaging method that is robust to the presence of static field inhomogeneities and flowing spins results from the pulse sequence design and imaging strategy of the present invention.

Figure 2:
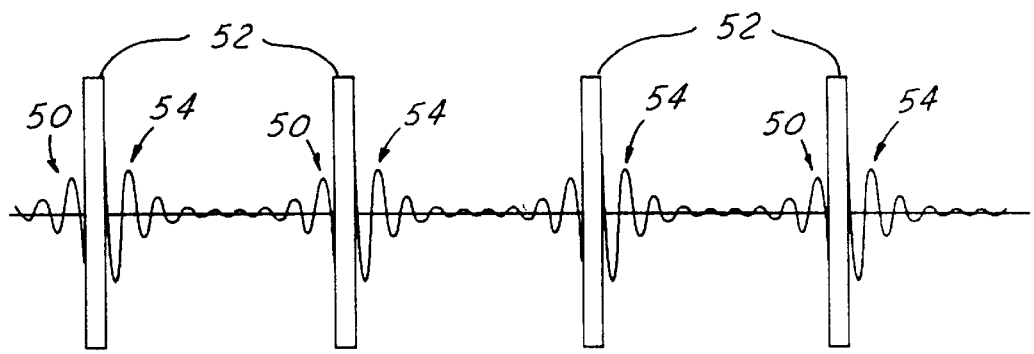
FIG. 2 is a plot illustrating rf pulses showing free induction to k and echoes.

Referring now to FIG. 2, the simplest way of understanding the evolution of magnetization towards coherent steady-state is based on the principle that any θ-pulse (θ: arbitrary flip angle) can be thought of as having a 0° pulse-like, a 90° pulse-like and a 180° pulse-like effect on any existing longitudinal and transverse magnetization. Thus, when a multitude of θ-pulses are applied, several echoes are formed, each with different T1 and T2 weighting, and temporally coincident with each new rf pulse. (Each transverse magnetization component with some phase history is called a coherence pathway because it can potentially lead to an echo (coherence) as long as rf pulses are applied periodically.) Clearly, the signal reaches a steady state when a large number of repetitions have been completed. In FIG. 2, the formation of spin echoes 50 coinciding with an rf pulse 52 followed by a free induction decay (FID) 54 is illustrated. It is seen that a normal FID follows the application of each new rf pulse, which then builds up coherence to form an echo just prior to the occurrence of the next rf pulse. By controlling the timing of the various gradient signals relative to the rf pulse, it has been found that the echo can be controlled to be positioned in a desired location between consecutive rf pulses.

Figure 3:
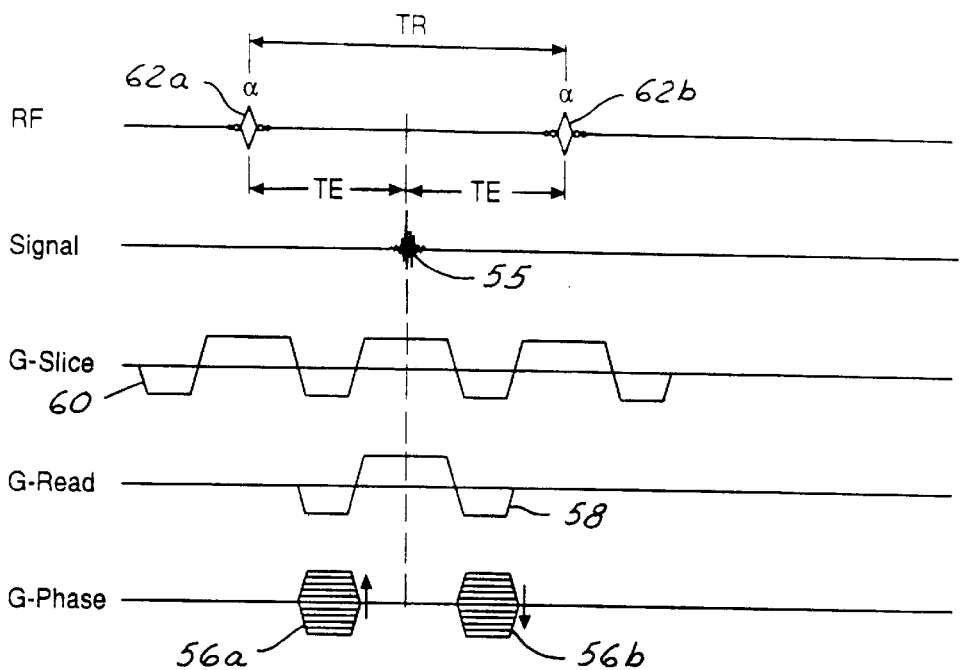
FIG. 3 is a time plot illustrating the timing of various grading signals with respect to the echo signal and rf signal.

Referring now to FIG. 3, imaging gradients are applied between the rf pulses as usual in imaging processes subject to the inventive sequence according to the present invention. That is, their timing has been modified according to the present invention. It is common to acquire the k-space data as gradient echoes 55, which in turn is ultimately processed into an image. All phase encoding (time-varying) gradient signals (G-Phase) 56*a* and 56*b,* view-encoding gradient signal (G-Read) 58 and slice-encoding gradient signal (G-Slice) 60 are rewound to ensure the build-up of steady-state. This ensures that the imaging gradient-induced spatial inhomogeneities are time-invariant from one repetition period TR to the next (i.e., these field inhomogeneities remain "static" from one repetition of the pulse sequence to the next). The repetition period TR is the space between rf pulses 62*a* and 62*b*. For the process according to the present invention, the echo time TE is set to be half of the repetition period TR.

The pulse sequence is designed using time-symmetric waveforms that are fully balanced so the net area (or zeroth moment) of each of the gradients is zero during the repetition period TR. The naturally velocity compensated design allows coherent steady-state imaging of moving spins. The relative timing of the read gradient signal 58 and slice-selection gradient signal 60 are symmetric between consecutive rf pulses 62*a* and 62*b* and about the center of the readout where a gradient echo 55 occurs. The gradient echo 55 is also centered between the rf pulses 62*a* and 62*b*. Preferably, the timing of the phase gradients 56*a* and 56*b* are also symmetric about the gradient echo 55. With this pulse sequence, both stationary and flowing spins attain coherent steady-state, the signal is independent of velocity and is sensitive only to static field inhomogeneities. Further, the spins will be velocity compensated during acquisition, ensuring that there will be little, if any, intravoxel dephasing due to the presence of a range of velocities within a voxel. The primary advantage of this pulse sequence design ensures that moving fluids (such as CSF in the cervical spine) also possess coherent steady-state signal properties, thereby producing images that highlight the CSF.

The sensitivity to static field inhomogeneities can also be further reduced using as short a TR as possible, which makes the resonance offset angle spread as small as possible, using alternating rf pulses to set the resonance offset angle spread out about β=π and using the optimal flip-angle for the tissue to be highlighted, which gives the largest resonance offset spread around β=π over which the signal is insensitive to resonance offset.

In terms of sequence design, the requirement that the gradient waveforms in the sequence are symmetric about the rf pulse in each TR means that, for the prescribed imaging parameters, the shortest possible timing of the gradient pulses satisfying the balancing and symmetry conditions will first have to be computed. Following this, the different hardware and patient safety constraints based on duty cycle and SAR limits will enforce the shortest sequence repetition time which could be greater than the purely imaging parameters-based and requirements-based computation. This means that a certain dead time will have to be added to each TR, half of which is added before readout and half following readout.

Considering the fact that the transverse magnetization is allowed to evolve over different number of repetition periods, the coherent steady-state signal is a function of the resonance offset angle per TR. For this argument, it is assumed that all imaging gradients are balanced over a TR, i.e., their zeroth moments are zero, so they do not add to the effective resonance offset angle from one rf pulse to the next. It is assumed that during the time between rf pulses, when the isochromats are allowed to precess and relax naturally in their own magnetic environments without any interference from applied rf pulses, i.e., this duration is a "free precession period." In the current case, this is roughly given by the sequence repetition time, TR. Of all the coherence pathways, only one (the isochromat population that will refocus after one more repetition period of free precession) will lead to an echo at the end of the precession period.

This "echoing" coherence pathway has a multitude of transverse magnetization components, each having gone through different numbers of free precession periods, either all in the transverse plane or some in the transverse plane and some along the longitudinal direction. The rest of the coherence pathways are non-echoing pathways, and will have to go through a certain number of free precession periods in the transverse plane before they are converted to the echoing pathway. From the above discussion, it is seen that the transverse magnetization just prior to, and immediately after, the occurrence of an rf pulse can both be written as the sum of infinite components, each having undergone a different number of free precession periods. This fact is indicated by the phase term $e^{-in\beta}$ in the expression for the transverse magnetization just immediately after an rf pulse in the steady-state:

$$M^+(\beta) = \sum_{n=-\infty}^{\infty} A_n e^{-in\beta} \quad [1]$$

Eq. [1] shows that the transverse magnetization immediately after an rf pulse and hence, the signal, must be a periodic function of $\beta$ from $-\pi$ to $\pi$ since the right-hand side of Eq. [1] is an infinite Fourier series. Remember that the Fourier coefficients $A_n$ are independent of $\beta$, i.e., an image of these Fourier coefficients would be independent of static field inhomogeneity effects. These Fourier coefficients can be computed using the expression:

$$A_n = \frac{1}{2\pi} \int_{-\pi}^{\pi} M^+(\beta) e^{in\beta} d\beta \quad [2]$$

This suggests the acquisition of $M^+$ for different values $\beta$ varying from $-\pi$ to $\pi$ (say, for N values of $\beta$) to obtain approximations to the $A_n$'s which are then robust to static field inhomogeneity effects. In a real imaging situation, this acquisition strategy is limiting because it will require long imaging times (re-acquisition of several data sets to cover the entire range of $\beta$ values), and there is no assurance that the imaged person will remain in the same position for all N acquisitions. It is therefore imperative to arrive at an imaging strategy that will render the image signal insensitive to the range of resonance offset values, thereby allowing the acquisition of a diagnostically meaningful image within the least number of acquisitions (if possible, one acquisition).

To make a simplistic argument to start with in understanding the steady-state signal behavior, a simple example is provided where the resonance offset angle within each voxel in the image is $\pi$ and the flip angle of the repeated sequence of rf pulses is 90°. This is a well-known driven equilibrium pulse sequence. (Driven equilibrium is predominantly used for T2 preparation in MR imaging.) This condition can be achieved in three different ways: by applying a [90-TR-(-90)-TR] pulse sequence with a zero resonance offset condition or a [90-TR-90-TR] pulse sequence with a resonance offset angle of $\pi$, or a [90-T-180-T-90] pulse sequence that has the same magnetization behavior for all resonance offset angles.

Under these conditions, the magnetization can be seen to reach a steady-state right after the first rf pulse. The steady-state signal is related to the transverse magnetization immediately following each rf pulse for which an expression is derived below:

$$M_\perp^+ = M_z^- = M_z^+ E1 + M_0(1-E1) = M_\perp^- E1 + M_0(1-E1) = (M_\perp^+ E2)E1 + M_0(1-E1)$$

Hence, $$M_\perp^+ = \frac{M_0(1-E1)}{(1-E1E2)} \cong M_0 \frac{TR/T1}{(TR/T1+TR/T2)} = M_0 \frac{T2/T1}{(1+T2/T1)} \quad [3]$$

In the above expression, the symbol $M_\perp$ represents transverse magnetization, and the + and − superscripts are used to indicate magnetization immediately after and just prior to any rf pulse in the pulse sequence, respectively. The final approximation assumes that TR is much shorter than both T1 and T2. The interesting aspect of this signal expression is its TR independence as long as TR>>T2, T1.

Figure 4:
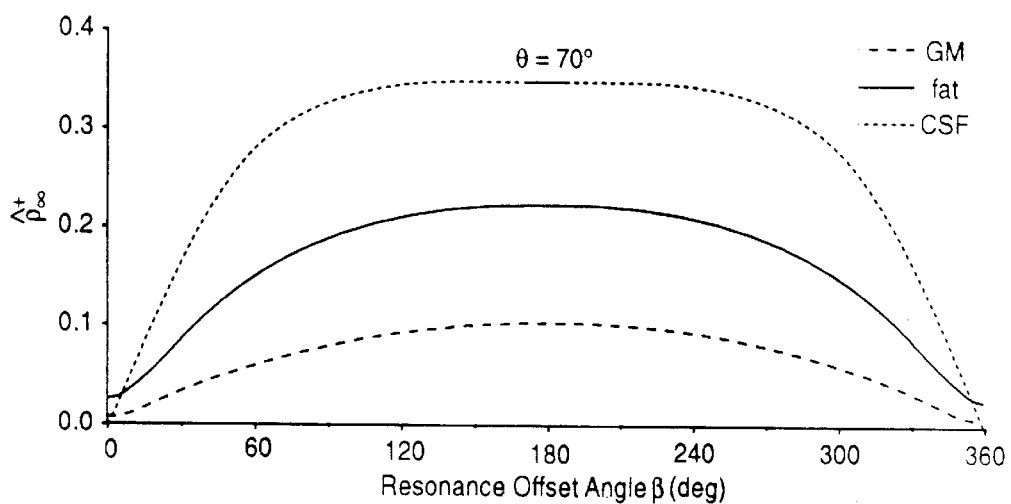
FIG. 4 is a plot of transverse magnetization behavior as a function of resonant offset angle for a flip angle (T) of 70 degrees.

Notably, this simplified expression indicates that the steady-state signal preferentially enhances fluids as they have large T2-to-T1 ratios. For example, in the brain, the cerebro-spinal fluid (CSF) is enhanced to roughly about a third of its thermal equilibrium magnetization value as it has a T2-to-T1 ratio of roughly ½. On the other hand, gray and white matter (GM and WM) are iso-intense since they have similar T2-to-T1 ratios and have relatively much smaller signal than CSF as is shown in FIG. 4 as a result of their significantly lower T2-to-T1 ratios. The significance of this finding lies in the fact that this pulse sequence can be used in a shortest-possible TR mode (within hardware and physical limitations) for fluid-enhancing applications without any time-related signal-to-noise ratio penalty. This is in direct contrast with fluid-enhancing pulse sequences such as long TE acquisitions with the fast spin echo pulse sequence which is normally considered efficient in that it uses all the imaging time for spatial encoding. The prohibitive need for a long relaxation time (free-precession period) for significant fluid enhancement actually makes it inherently time-inefficient except in an interleaved multi-slice acquisition mode. Even otherwise, the need to use refocusing pulses in fast spin echo pulse sequences to repetitively form spin echoes adds significantly to the imaging time. On the other hand, the steady-state pulse sequence can be driven in a single thick-slab 3D imaging mode which also allows for full flexibility in spatial resolution along all three spatial dimensions.

Looking further to the more general case of a generic flip-angle choice, the steady-state signal expression can be obtained by writing the Bloch equation solution including relaxation terms for short-lived rf pulses and solving for the steady-state equilibrium magnetization values. (The "Bloch equation with relaxation terms" describes an equation of motion of the magnetization components, and their longitudinal and transverse relaxation in a phenomenological fashion. The Bloch equation plays a central role in the understanding of signal behavior of different pulse sequences.) From such a derivation, it can be shown that the expression in Eq. [3] is valid (to a factor of sin θ) for large flip angles in the vicinity of 90°. Further, it can be shown for the $\beta=\pi$ case that an "optimal" flip-angle that maximizes the steady-state signal for a given tissue can be found. The expression for this optimal flip angle is:

$$\theta_{opt} = \cos^{-1}\left\{\frac{(T1/T2-1)}{(T1/T2+1)}\right\} \quad [4]$$

Figure 5:
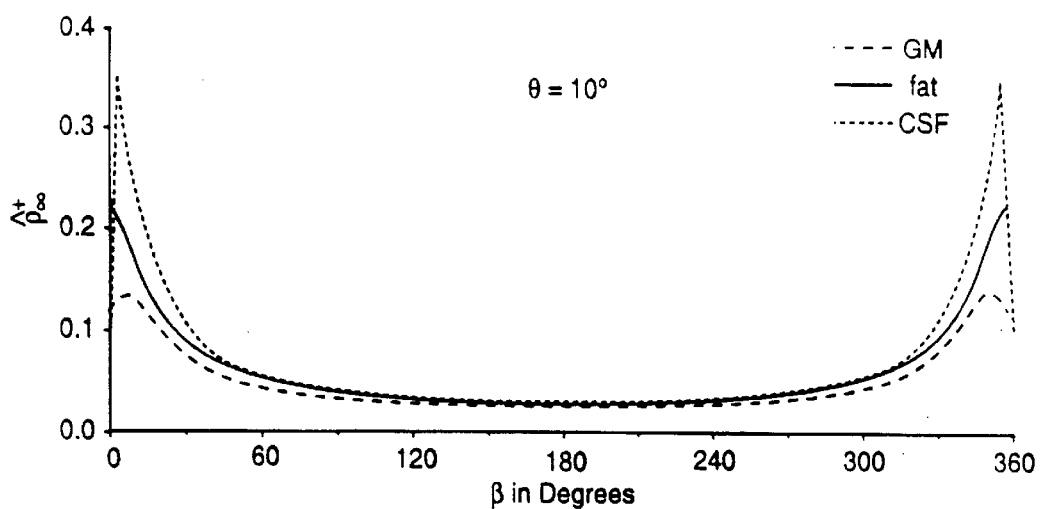
FIG. 5 is a plot of transverse magnetization behavior as a function of resonance angle for a flip angle of 10 degrees.
Figure 6:
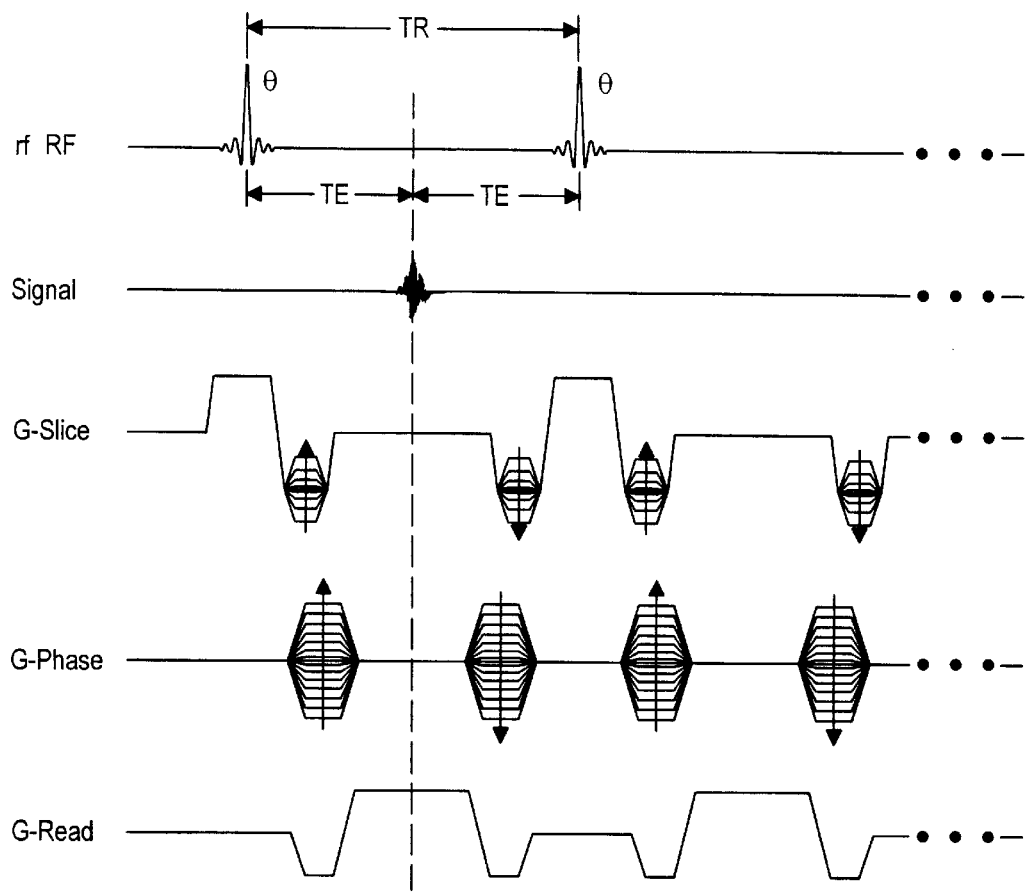
FIG. 6 is a plot output of three gradients versus an rf pulse according to the present invention.

One more result of deriving a steady-state magnetization expression for the generic case is that the steady-state signal can be computed and plotted as a function of resonance offset angle for different flip-angles such as in FIGS. 4 and 5.

It can be observed from FIG. 4 that the steady-state signal is insensitive to a range of resonance offset angles (in the neighborhood of resonance offset angle of 180°) at the optimal flip angle (θ=70° is the optimal flip-angle for CSF). At any other flip angle, the range of resonance offset angles that the steady-state signal is insensitive to is reduced (as demonstrated in FIG. 4 for gray matter (GM) and fat). The signal behavior as a function of β appears similar to that at the optimal flip angle for all flip angles above $\theta_{opt}$, with the region of insensitivity to β reduced. For flip angles below $\theta_{opt}$, the signal has a double-peaked behavior as a function of $\beta$, with the peak signal values equaling that given in Eq. [3], but occurring away from $\beta=\pi$. The separation (in $\beta$) between the peaks and the level of suppression of the signal for $\beta=\pi$ both increase as the flip angle is reduced more and more below $\theta_{opt}$.

In a real imaging situation, a range of static field inhomogeneities will exist across the object of interest. For this case, the use of a flip angle that equals the optimal flip angle for the tissue-of-interest makes the acquisition robust since it is least sensitive to field inhomogeneities as long as the acquisition is "biased" at $\beta=\pi$ (the resonance offset insensitivity range is roughly $\pi$ radians around $\beta=\pi$). An immediate point to note is that the shortest possible TR will provide the utmost robustness to static field inhomogeneities as it reduces the spread of $\beta$ values across the field-of-view being imaged. In case a large range of static field inhomogeneities exists such that the range of $\beta$ values is still greater than $\pi$, the signal can be re-acquired a second time at the optimal flip angle using a scheme that biases the resonance offset at $\beta=0$. Then, one of the two images will have the signal given in Eq. [3], thereby a maximum operator applied to the two signals at each spatial location yields a new image whose signal is essentially independent of resonance offset angle.

The solution for small flip-angles, an extension of the behavior for flip angles below $\theta_{opt}$, also leads to an interesting result. This is almost the exact complement of the curves shown in FIG. 4. Here, the signal is high, approaching the same value as when $\theta$ is 90 degrees, only for a specific resonance offset angle in the vicinity of $\beta=0$. (This comes as no surprise, given the discussion in the last-but-one paragraph.) This "selectivity" of small flip-angle coherent steady-state sequences can be utilized to selectively image chemically shifted Hydrogen ($^1$H) species, for example, to selectively image fat only or water only. The requirements are a flip angle much smaller than the optimal flip angle, a homogeneous field and a specific choice of TR that ensures the resonance offset of the species that is to be avoided is $\pi$ radians (see FIG. 5, for example).

It has been shown in prior art, "*Motion-Insensitive, Steady-State Free Precession Imaging*", Y. Zur, M. L. Wood and L. J. Neuringer, Magn. Reson. Med., 16: 444–459 (1990), that each of the gradient waveforms need to balanced to ensure that the full steady-state signal of Eq. [1] is acquired for all spins including those flowing with uniform velocity. A gradient waveform whose zeroth moment or time-integral over each TR is zero is said to be "balanced." This is based on the argument that the resonance offset angle acquired from one TR to the next needs to be independent of the repetition period. A condition for flow-insensitive steady-state imaging by revisiting this result is obtained as will be further described below. The resonance offset angle acquired during the $n^{th}$ repetition period is given by the difference between the phases accumulated up to the $n^{th}$ rf pulse and up to the $(n-1)^{st}$ rf pulse. It is imperative that the resonance offset angle accumulated between consecutive rf pulses be independent of the repetition number for the achievement of steady state. Ignoring the effects of background field inhomogeneities, suppose a gradient waveform G(t) is applied along the direction of flow x such that $x(t)=x_0+vt$. The resonance offset angle acquired during the $n^{th}$ repetition period for such a flowing spin is:

$$\beta(n) = \phi(n) - \phi(n-1), \quad n \geq 1 \quad [5]$$

$$= \gamma \int_0^{nTR} x(t)G(t)dt - \gamma \int_0^{(n-1)TR} x(t)G(t)dt$$

-continued $$= \gamma \int_{(n-1)TR}^{nTR} x(t)G(t)dt$$

$$= \gamma x_0 \int_{(n-1)TR}^{nTR} G(t)dt + \gamma v \int_{(n-1)TR}^{nTR} tG(t)dt$$

$$= \gamma x_0 \int_0^{TR} G(t')dt' + \gamma v \int_0^{TR} t'G(t')dt' + \gamma v(n-1)$$

$$TR \int_0^{TR} G(t')dt'$$

From Eq. [5], it is seen that the zeroth moment of the gradient waveform needs to be zero to ensure that steady-state is attained.

One more term (the second term in Eq. [5]), making the steady-state resonance offset angle dependent on velocity, remains. This term, the first moment of the gradient waveform as a function of time over TR, also needs to be zero to ensure that the resonance offset angle is independent of velocity. One of the easiest ways of achieving this is through the use of time-symmetric gradients in each TR as shown in "Chapter 23: Motion Artifacts and Flow Compensation" in "*Magnetic Resonance Imaging: Physical Principles and Sequence Design*," E. M. Haacke, R. W. Brown, M. R. Thompson and R. Venkatesan, pp. 669–701, John Wiley and Sons (1999). Consider an arbitrarily time-varying gradient waveform that possesses a point of symmetry. The first moment is computed from the extreme left of the point of symmetry to its extreme right as shown below. In this calculation, it is assumed that the time point t=0 is the point of symmetry so that $G(-t)=G(t)$ for $t>0$:

$$\int_{-\infty}^{\infty} tG(t)dt = \int_{-\infty}^{0} tG(t)dt + \int_0^{\infty} tG(t)dt \quad [6]$$

$$= \int_{\infty}^{0} (-t)G(-t)(-dt) + \int_0^{\infty} tG(t)dt$$

$$= \int_{\infty}^{0} tG(t)dt + \int_0^{\infty} tG(t)dt$$

$$= 0$$

Therefore, any arbitrary gradient waveform that has a point of symmetry has a zero first-order moment at the end of the waveform, i.e., such waveforms are naturally velocity compensated. ("Velocity compensation" is the removal of the effect of the velocity term of the instantaneous position of a flowing spin. This is achieved by "nulling" the first moment of the gradient waveform.) Based on this finding, the pulse sequence was designed using gradient waveforms that were symmetric about the center of each rf pulse and center of each readout. This design property (symmetry about the center of each readout) makes the steady-state signal velocity-compensated in the read direction and slab-select direction for each readout in addition to ensuring that the steady-state signal is independent of the flow velocity.

An example of a pulse sequence formed according to the present invention is illustrated in FIGS. 6a–6d. As seen in these plots, this pulse sequence is designed to have symmetry from rf pulse to rf pulse as well as from the center of each readout to the next. This gives it the required velocity compensated design feature, allowing flowing spins to reach the same steady state as that of stationary spins. It is also seen that both the phase encoding and slice encoding gradients are placed as close to the beginning of the readout, ensuring minimization of any oblique flow spatial misregistration.

One application of the sequence of the present invention is where fluids need to be highlighted in regions that require high resolution, 3D acquisitions. The sequence becomes feasible to use in such applications because of its requirement that as short a TR as possible is used by the pulse sequence, thereby allowing 3D imaging in reasonable imaging times.

The main advantage of the present invention stems from its inherent velocity compensation property. Other known systems suffer from the motion-crushing properties of the resonance offset averaging gradient pulses present in these pulse sequences. The second advantage is its potential of allowing the recovery of velocity compensated $A_0$ and $A_1$ components (of Eq. [2]) from the signal acquired using the present invention at a few resonant offset angles covering the period 0 to $2\pi$ of resonance offset angles: "Motion-Insensitive, Steady-State Free Precession Imaging," Y. Zur, M. L. Wood and L. J. Neuringer, Magn. Reson. Med., 16: 444–459 (1990). Both these properties make the present invention attractive for use in imaging the cervical spine where the CSF flow is significant enough to cause signal voids or saturation effects in FSE-like sequences, whereas, the present invention is capable of providing consistent CSF-to-cord contrast.

Figure 7:
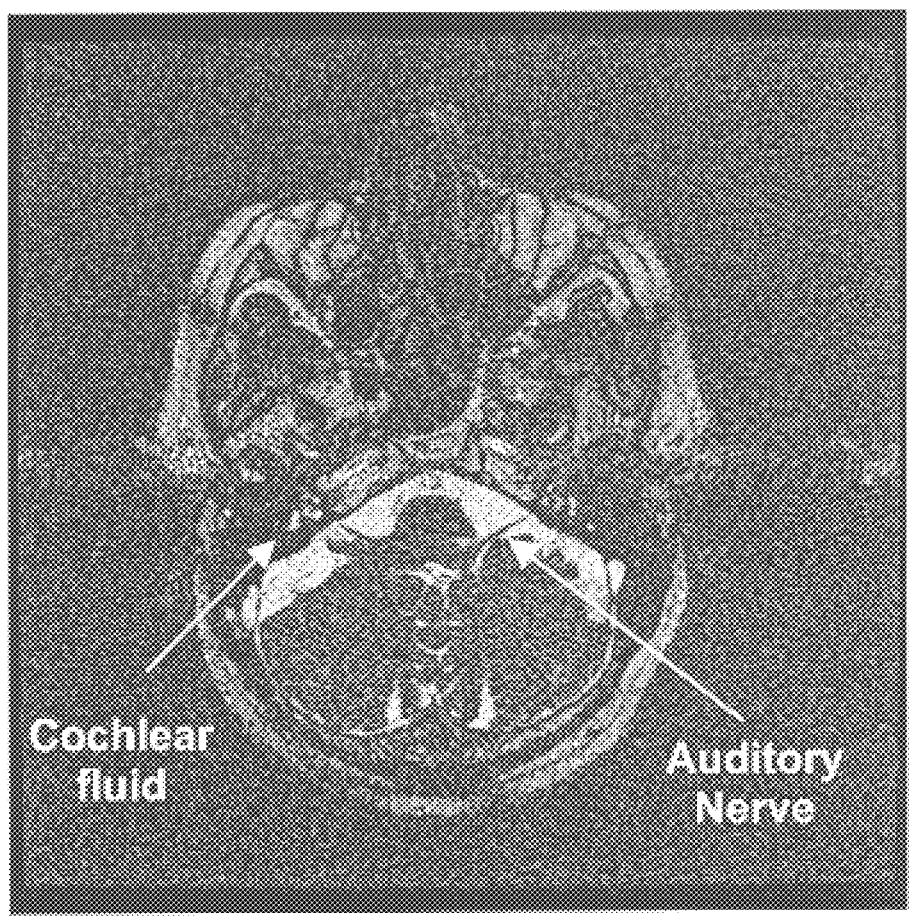
FIG. 7 is an image of auditory nerves and the cochlear cavity formed using the present invention.

As shown in FIG. 7, a secondary advantage of using the present invention is its ease of acceptance in applications requiring high resolution 3D imaging such as in the imaging of the inner ear structures such as the cochlear cavity as well as in imaging the cranial nerves in the cerebello-pontine angle. In both cases, there is a need to provide very high contrast between fluid, which can be highlighted, and nearby tissue/nerves that needs to be as dark as possible, and such contrast is provided by running the present invention with a flip angle of about 70° ($\theta_{opt}$ for CSF).

In FIG. 7, a depiction of auditory nerves (dark lines in bright CSF strip around the cerebellum) and the fluid-filled cochlear cavity is provided as an example. The above image is from a high resolution (256×512) 3D volume acquired with 0.7 mm thick slices and 1 NEX. This high resolution is required for depicting small abnormalities in the nerves or in the cochlear cavity. The 20 slice data set was acquired in less than 1-½ minutes.

A third application of the present invention is its potential of improving the diagnostic ability of low- to mid-field MR imaging systems, where the main role played by MRI is in providing nice T2-weighted images in reasonable imaging times. Since it is known that the T1's of tissues tend to become shorter as the field strength becomes smaller, whereas T2's are basically independent of field strength, it can be deduced that the T2-to-T1 ratio of all tissues will tend to approach that of CSF as we approach lower field strengths. A feature of the present invention is that its signal depends on the T2-to-T1 ratio independent of TR as long as TR<<T2. This tells us that the signal-to-noise ratio per unit time at low fields can be increased as long as TR can be shortened by improving the gradient hardware capability available on low-field systems. Of course, this sequence does not increase the applications base of low-field systems by providing a new contrast mechanism. However, it increases the applicability of low-field systems in time-critical spin density-weighted and fluid-enhancing (typically T2-weighted) diagnostic imaging applications.

The present invention may also be use to create an enhancement of the blood signal following contrast agent injection. This is a direct result of the fact that T1 reductions are much higher in percentage than T2 reductions with increase in contrast agent concentration, thereby causing T1 to approach T2 as the contrast agent concentration in the blood increases. This makes the sequence an ideal candidate in acquiring signals used for computing the relative blood volume in tissues such as the brain or the myocardium.

Figure 8A:
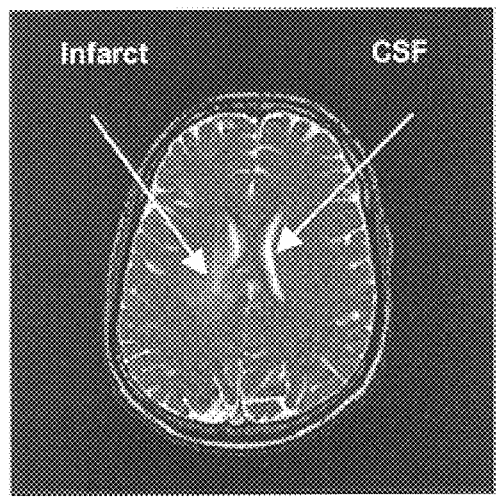
FIGS. 8(a), 8(b) and 8(c) are respective images of an active tumor in a pre-contrast agent state, with a contrast agent and a subtraction image.
Figure 8B:
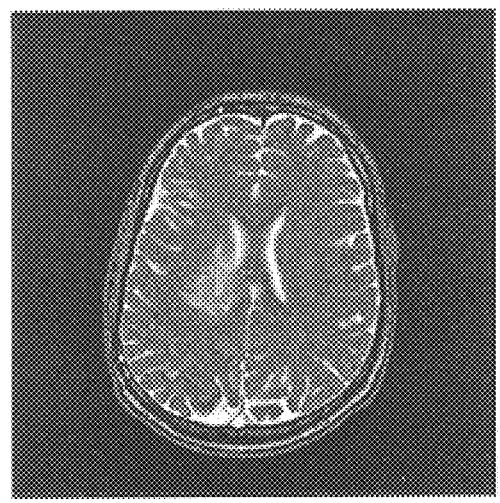
Figure 8C:
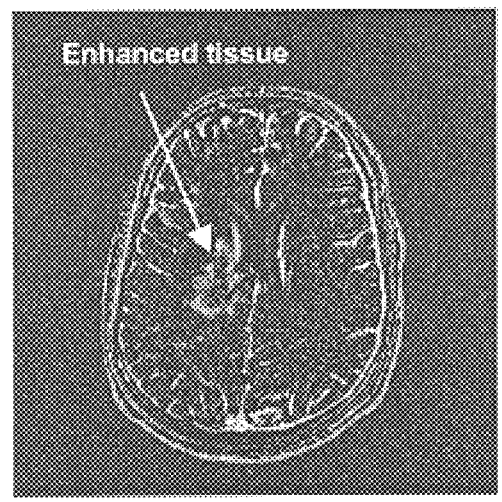

Referring now to FIGS. 8(a) to (c), it can also be used in tumor studies to differentiate active tumor from edema and infarcted tissue based on a pre- and a post-contrast acquisition. The pre-contrast acquisition (FIG. 8(a)) would only highlight the edematous and infarcted regions (edematous tissue highlighted as bright as the CSF, whereas infarcted regions are intermediate grey). On the other hand, the post-contrast acquisition (FIG. 8(b)) would highlight both the edematous and infarcted regions as well as the region of blood-brain barrier breakdown, the active tumor (FIG. 8(c)). This approach will be useful in infarct sizing in neuro and cardiac applications. Its 3D nature also potentially makes the pulse sequence an ideal candidate for high resolution coronary artery imaging with the new generation high relaxivity contrast agents. The enhancement of blood compartments also makes the pulse sequence of the present invention advantageous for diagnosing and differentiating enhancing from non-enhancing tumors of the inner-ear and cranial nerves.

With the advent of Blood Oxygenation Level-Dependent (BOLD) contrast-based separation of veins from arteries, it should be possible to use the resonance offset tuned low flip-angle imaging using the present invention to separate veins from arteries. Since the tuneability of the signal response depends on the full-width at half-maximum of the "passband" of the low flip-angle signal as a function of resonance offset angle, this can be made arbitrarily thin or thick depending on TR for a given chemical shift. In the artery-vein separation problem, the chemical shift is quite small, and the TR choice needs to be optimized based on the artery-to-vein signal difference required to "reliably differentiate" one from the other.

While the invention has been described in connection with one or more embodiments, it should be understood that the invention is not limited to those embodiments. On the contrary, the invention is intended to cover all alternatives, modifications, and equivalents, as may be included within the spirit and scope of the appended claims.

What is claimed is:

1. A method of magnetic resonance imaging of a patient comprising the steps of:

applying a first rf pulse and a second rf pulse having a repetition time;

generating a first gradient waveform substantially centered within said repetition time and substantially symmetric about at least one of said first rf pulse and said second rf pulse;

generating a second gradient waveform substantially centered within the repetition time;

receiving a resonance signal substantially centered within the repetition time; and forming an image in response to said resonance signal.

2. A method as recited in claim 1 wherein said first gradient waveform is balanced.

3. A method as recited in claim 1 wherein said second gradient waveform is balanced.

4. A method as recited in claim 1 wherein said first gradient waveform comprises a slice gradient.

5. A method as recited in claim 1 wherein said first gradient waveform comprises an x-axis gradient.

6. A method as recited in claim 1 wherein said second gradient waveform comprises a phase gradient.

7. A method as recited in claim 1 wherein said second gradient waveform comprises a y-axis gradient.

8. A method as recited in claim 1 further comprising the step of applying a third gradient waveform substantially centered with said repetition time.

9. A method as recited in claim 8 wherein said third axis gradient is balanced.

10. A method as recited in claim 8 wherein said third axis gradient comprises a z-axis gradient.

11. A method as recited in claim 8 wherein said third axis gradient comprises a phase gradient.

12. A method as recited in claim 1 further comprising the steps of introducing a contrast agent into a blood stream of the patient.

13. A method as recited in claim 1 further comprising the step of allowing flowing spins to attain a steady state as that of stationary spins.

14. A method as recited in claim 1 further comprising the step of reducing a first range of resonant offset angles for the first gradient waveform to reduce sensitivity to magnetic field inhomogeneities.

15. A method as recited in claim 1 wherein said repetition time is such so that a resonant offset angle is independent of a velocity of moving spins within a moving fluid.

16. A method as recited in claim 1 wherein the image is selected from the group an image of a cervical spine, cochlear cavity and cranial nerves.

17. A method of magnetic resonance imaging of moving fluid having spins therein in a patient comprising the steps of:
 applying a first rf pulse and a second rf pulse having a repetition time;
 generating a first gradient waveform balanced and centered within said repetition time and substantially symmetric about at least one of said first rf pulse and said second rf pulse;
 generating a second gradient waveform balanced and centered within the repetition time;
 generating a third gradient waveform balanced and centered within the repetition time;
 reading a signal substantially centered within the repetition time;
 forming an image in response to the signal.

18. A method as recited in claim 17 wherein said first gradient comprises a slice gradient.

19. A method as recited in claim 17 wherein said first gradient comprises an x-axis gradient.

20. A method as recited in claim 17 wherein said second gradient comprises a phase gradient.

21. A method as recited in claim 17 wherein said second gradient comprises a y-axis gradient.

22. A method as recited in claim 17 wherein said third axis gradient comprises a z-axis gradient.

23. A method as recited in claim 17 wherein said third axis gradient comprises a phase gradient.

24. A method as recited in claim 17 further comprising the step of introducing a contrast agent into a blood stream of the patient.

25. A method as recited in claim 17 further comprising the step of allowing flowing spins to attain a steady state as that of stationary spins.

26. A method as recited in claim 17 further comprising the step of reducing a first range of resonant offset angles for the first gradient to reduce sensitivity to magnetic field inhomogeneities.

27. A method as recited in claim 17 wherein said repetition time is such so that a resonant offset angle is independent of a velocity of moving spins within a moving fluid.

28. A method as recited in claim 17 wherein the image is selected from the group consisting of an image of a cervical spine, cochlear cavity and cranial nerves.

29. A method as recited in claim 17 further comprising the steps of inducing spatial inhomogeneities in response to the step of applying a first rf pulse and a second rf pulse, generating the first gradient waveform, generating the second gradient waveform, and generating the third gradient waveform.

30. An imaging apparatus comprising:
 a transmitter coil generating a first rf pulse and a second rf pulse having a repetition time therebetween;
 a first gradient coil generating a first gradient waveform substantially centered within said repetition time and substantially symmetric about at least one of said first rf pulse and said second rf pulse;
 a second gradient generating a second gradient coil waveform substantially centered within the repetition time;
 a receiver coil receiving a resonance signal substantially centered within the repetition time; and
 a controller coupled to said receiver coil and forming an image in response to said resonance signal.

* * * * *

UNITED STATES PATENT AND TRADEMARK OFFICE
CERTIFICATE OF CORRECTION

PATENT NO. : 6,587,708 B2  
DATED : July 1, 2003  
INVENTOR(S) : Ramesh Venkatesan, Amjad Jabbar and Tisha Ahraham It is certified that error appears in the above-identified patent and that said Letters Patent is hereby corrected as shown below:

<u>Title page, Item [54] and Column 1, lines 1-3,</u>
Please correct the title to read -- METHOD AND APPARATUS FOR COHERENT STEADY-STATE IMAGING OF CONSTANT-VELOCITY FLOWING FLUIDS --

Signed and Sealed this

Eleventh Day of May, 2004

JON W. DUDAS
*Acting Director of the United States Patent and Trademark Office*